Nov. 13, 1951
R. L. HENSON
2,574,477
AMPLIFYING CIRCUIT FOR SUPPRESSING SURGES
CAUSED BY GAIN CONTROL
Filed Sept. 12, 1945
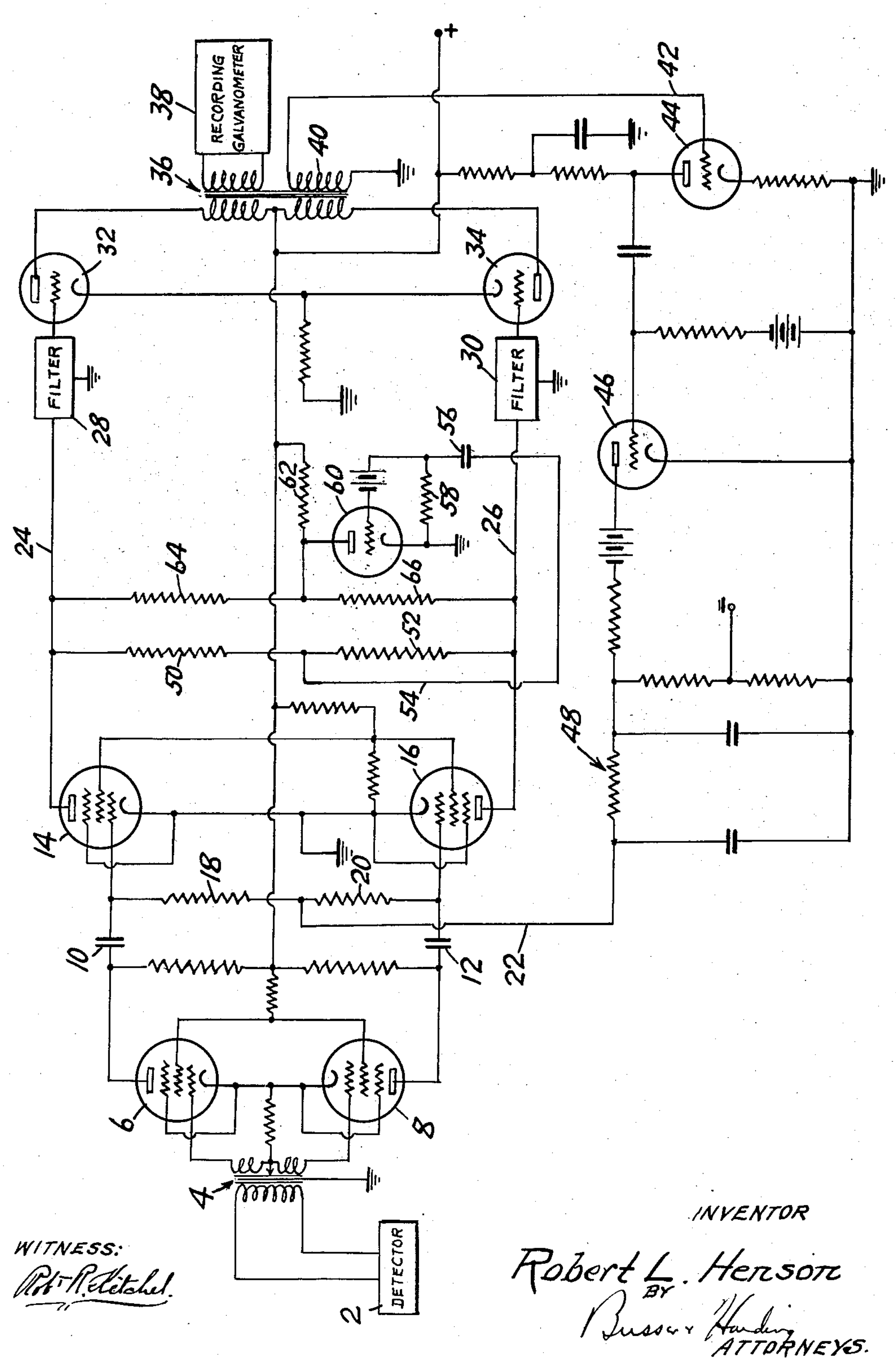
WITNESS:
Robt R. Ketchel
INVENTOR
Robert L. Henson
BY
Bussey & Harding
ATTORNEYS.

Patented Nov. 13, 1951 2,574,477

UNITED STATES PATENT OFFICE 2,574,477

AMPLIFYING CIRCUIT FOR SUPPRESSING SURGES CAUSED BY GAIN CONTROL

Robert L. Henson, Beaumont, Tex., assignor to Sun Oil Company, Philadelphia, Pa., a corporation of New Jersey Application September 12, 1945, Serial No. 615,836

2 Claims. (Cl. 179—171)

This invention relates to amplifying circuits, and has particular utility in connection with the amplification of signals to be recorded in seismographic geophysical prospecting.

In seismographic prospecting, the energy detected by the geophones decreases rapidly with time following the explosion. Since this energy must be amplified before it is recorded, it is necessary to use an amplifier the gain of which will vary with time in accordance with the amplitude of the incoming energy. The amplitude of this energy may change by a factor of ten thousand times in an interval from two to four seconds. To provide a suitable amplifier and automatic volume control to record this energy properly is difficult. This is so not only because of the tremendous requirements placed on the automatic volume control, but also because of the very small signal levels encountered, for example, as low as one microvolt, and the high gain consequently required.

The common method of controlling the output level of an amplifier is to utilize the output signal to develop a direct voltage which is used to bias certain tubes of the amplifier in such fashion as to increase their gain with decrease of the output level. When a negative control voltage is applied to the grid of a pentode of remote cut-off type, the slope of the tube characteristic is decreased and consequently its gain is decreased. Normally, due to the change in plate voltage which accompanies this change in gain, a large and undesirable voltage surge is passed on to subsequent circuits of the amplifier when the control voltage is applied. This situation can be considerably improved by using push-pull stages, but this improvement is generally insufficient. Since the signal level at the point in the amplifier where the control is applied may be only a few millivolts, it is easy to see why control voltage surges of the order of fifty volts cannot be tolerated.

In accordance with the present invention, an amplifying circuit is provided, in which such surges are suppressed, to a satisfactory degree. It is generally unnecessary to prevent the plate voltage from changing, providing the changing can be made to take place slowly.

The circuit has a secondary advantage in reducing the gain of the controlled stage with respect to inphase voltage components. This is highly desirable inasmuch as the direct control voltage which is applied will usually contain alternating components despite reasonably effective filtering.

It may be pointed out in passing that a transformer coupling will accomplish the prevention of the surges of the type described. However, transformer coupling is not generally satisfactory because of the very high plate resistances of remote cut-off pentode tubes which are used in automatic volume control circuits of the type mentioned. Accordingly, the invention is particularly applicable to circuits in which such tubes are controlled.

The general object of the invention may be stated to be the accomplishment of the suppression of surges in the fashion indicated. While reference will be made particularly to a seismographic detector circuit, it will be evident that the invention is of more general application where automatic volume control is required to produce large changes in gain of an amplifying circuit with suppression of surges. The foregoing and other objects of the invention will become apparent from the following description read in conjunction with the accompanying drawing in which the figure is a diagram of the improved circuit.

A detector such as a geophone is indicated at 2, coupled through a transformer 4 to a push-pull arrangement of pentodes 6 and 8 constituting the first stage of amplification. The plates of these tubes are coupled through the respective condensers 10 and 12 to the grids of remote cut-off pentodes 14 and 16 to which the automatic control is applied. Resistors 18 and 20 of equal value are connected in series between the grids of the tubes 14 and 16. To their junction there is applied through the line 22, the automatic control voltage in a fashion hereafter described.

The plates of the tubes 14 and 16 are coupled through the lines 24 and 26 and respective filters 28 and 30 to the grids of amplifying tubes 32 and 34, which are arranged in push-pull circuit with the output transformer 36, the secondary of which delivers current to the recording galvanometer 38. It will, of course, be understood that additional amplification stages may be provided. The filters 28 and 30 may be of types conventional in the art for the purpose of passing only desired frequency bands to the galvanometer.

A second secondary 40 of the transformer 36 delivers an output voltage through the connection 42 to the grid of a tube 44. The output of this is coupled to the grid of a tube 46 which has a rectifying action so as to provide, through the filter 48, arranged to remove alternating components, a direct biasing voltage to the connection 22. This biasing arrangement is conventional and its components and operation need not be further described. Its action, in brief, is to increase the gain of the pentodes 14 and 16 when the output signal amplitude decreases and vice versa. As will be evident, this change in gain, particularly if it is of considerable magnitude, will also involve a correspondingly large change in plate voltage, which in circuits, heretofore, produced a surge passed on to the subsequent amplifying stages, which surge the present invention is designed to reduce.

Resistors 50 and 52 are connected between the lines 24 and 26 and have their junction connected through the line 54 and condenser 56 to the suitably biased grid of a triode 60. A resistor 58 is connected between the grid side of the condenser 56 and the grounded cathode of the tube 60. The plate voltage for the pentodes 14 and 16 is applied thereto through a resistor 62 and the balanced resistors 64 and 66 to the junction of which the resistor 62 is connected. This junction is also joined to the plate of the tube 60. The plate-cathode circuit of the tube 60 is accordingly connected in parallel with the plate feed circuits of the pentodes. Accordingly, due to the presence of the resistor 62, the applied pentode plate voltage will decrease with an increase of current through the tube 60. In order to suppress to a maximum degree the plate voltage change of the tubes 14 and 16, there may be more tubes than one in the position of tube 60 connected in parallel therewith.

The surge suppressing characteristics of the circuit will now be apparent. If the plate voltage of the tubes 14 and 16 tends to decrease, the grid of the tube 60 will become negative, thereby reducing the current through this tube and so increasing the voltage applied to the plates of the pentodes. The converse is also true. As a result, plate voltage surges are minimized. At the same time, no substantial effect on the signal components occurs, nor is there any interference with the gain control of the pentodes. Due to the condenser 56 and resistor 58, the change in plate voltage over an extended period may not be suppressed, but the rate of change is slowed down so that surge does not occur. It may be noted that a slow change of plate voltage is not at all objectionable, so long as the rate of change is minimized. If, however, the change is to be suppressed entirely, there may be a direct connection instead of the connection through the condenser 56, in which case, however, as will be evident, suitable batteries or other voltage supplies will have to be introduced to keep the direct potentials in the circuit at the proper values.

As will be evident, this control of the plate voltage of the pentodes will also serve to suppress inphase components in the amplifier. As an example, it was found that with an arrangement which would reduce a change in plate voltage for particular conditions from 25 volts to 2 volts, the reduction in inphase signals was found to be of the order of ten. It will be apparent that more complicated systems involving further amplification might be used to give closer regulation; however, the simple circuit herein shown has been found to be quite sufficient in its regulatory action for seismographic amplifying purposes.

It will be clear from the above that variations may be made by those skilled in the art in the specific embodiment of the invention without departing from the scope thereof, as defined in the following claims.

What I claim and desire to protect by Letters Patent is:

1. An amplifying circuit comprising a pair of tubes of variable gain type connected in push-pull with respect to signal input, each of said tubes having an anode connected to an anode supply through a load resistor, means for automatically increasing the gain of each of said tubes with decrease of amplitude of signals transmitted therethrough, and means for automatically suppressing changes of anode voltage of said tubes when their gain is varied, the last mentioned means comprising a grid-controlled tube having its anode-cathode circuit arranged to shunt the anode supply of the first mentioned tubes to effect reduction in anode voltage of both of the first mentioned tubes upon increase of current through said anode-cathode circuit, and means connecting the grid of the third mentioned tube to the junctions of the anodes of the first mentioned tubes and their respective load resistors.

2. An amplifying circuit comprising a pair of tubes of variable gain type connected in push-pull with respect to signal input, each of said tubes having an anode connected to an anode supply through a load resistor, means for automatically increasing the gain of each of said tubes with decrease of amplitude of signals transmitted therethrough, and means for automatically reducing the rate of change of anode voltage of said tubes when their gain is varied, the last mentioned means comprising a grid-controlled tube having its anode-cathode circuit arranged to shunt the anode supply of the first mentioned tubes to effect reduction in anode voltage of both of the first mentioned tubes upon increase of current through said anode-cathode circuit, and means connecting the grid of the third mentioned tube to the junctions of the anodes of the first mentioned tubes and their respective load resistors.

ROBERT L. HENSON.

REFERENCES CITED

The following references are of record in the file of this patent:

UNITED STATES PATENTS

| Number | Name | Date |
|---|---|---|
| 2,008,703 | Hammond, Jr. | July 23, 1935 |
| 2,063,304 | Farrow | Dec. 8, 1936 |
| 2,096,757 | Purington | Oct. 26, 1937 |
| 2,179,263 | Koch | Nov. 7, 1939 |
| 2,235,550 | Fyler | Mar. 18, 1941 |
| 2,255,683 | Singer | Sept. 9, 1941 |
| 2,339,406 | Holden | Jan. 18, 1944 |